(12) United States Patent
Lim

(10) Patent No.: US 7,696,596 B2
(45) Date of Patent: Apr. 13, 2010

(54) BIPOLAR JUNCTION TRANSISTOR AND CMOS IMAGE SENSOR HAVING THE SAME

(75) Inventor: Su Lim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 303 days.

(21) Appl. No.: 11/841,040

(22) Filed: Aug. 20, 2007

(65) Prior Publication Data

US 2008/0048222 A1    Feb. 28, 2008

(30) Foreign Application Priority Data

Aug. 22, 2006    (KR) .................. 10-2006-0079324

(51) Int. Cl.
*H01L 31/06*    (2006.01)

(52) U.S. Cl. ................ 257/461; 257/225; 257/E27.133

(58) Field of Classification Search .............. 257/461, 257/463, 80, 225, 290, 291, 292, E27.133, 257/E27.134, E27.135
See application file for complete search history.

(56) References Cited

U.S. PATENT DOCUMENTS

| 5,243,207 A | 9/1993 | Plumton et al. |
| 6,225,670 B1 * | 5/2001 | Dierickx .................. 257/431 |

* cited by examiner

*Primary Examiner*—David Vu
(74) *Attorney, Agent, or Firm*—Sherr & Vaughn, PLLC

(57) ABSTRACT

Embodiments relate to a horizontal type bipolar junction transistor element (BJT) and a CMOS image sensor having the same to form a photodiode. In embodiments, the bipolar junction transistor as well as collector current may flow uniformly in a horizontal direction, which may increase the entire amount of current. In embodiments, large current gain may be obtained. In embodiments, a bipolar junction transistor element with various current gains can be manufactured.

13 Claims, 8 Drawing Sheets

BIPOLAR JUNCTION TRANSISTOR AND CMOS IMAGE SENSOR HAVING THE SAME

The present application claims priority under 35 U.S.C. 119 and 35 U.S.C. 365 to Korean Patent Application No. 10-2006-0079324 (filed on Aug. 22, 2006), which is hereby incorporated by reference in its entirety.

BACKGROUND

An image sensor may be a semiconductor device to convert an optical image into an electrical signal. An image sensor may be a charge coupled device (CCD), where individual metaloxide-silicon (MOS) capacitors may be located adjacent each other and may store charge carriers and may further transfer them. Alternatively, an image sensor may be a CMOS (complementary MOS) image sensor, which may adopt a switching manner. A CMOS device may include as many MOS transistors as a number of pixels. A CMOS device may include, as peripheral circuits, a control circuit and a signal processing circuit, and may sequentially detect outputs using such circuits.

A CMOS image sensor may implement images by forming a photodiode and a MOS transistor in a unit pixel and detecting the signals in the switching manner.

In a related art process of manufacturing a CMOS image sensor, an NPN element may be manufactured by applying a CMOS process to an epi-layer.

FIG. 1 is a drawing illustrating a related art horizontal type NPN bipolar junction transistor element and FIG. 2 is a drawing illustrating a cross section of the horizontal type NPN bipolar junction transistor element shown in FIG. 1.

Referring to FIGS. 1 and 2, the horizontal type NPN bipolar junction transistor element may include shallow trench isolation (STI) area 160, which may be a device isolating area, on P-type semiconductor substrate 100 and may include P-well 112 and N-well 110.

N-type emitter E, P-type base B, and N-type collector C may be formed in P-well 112, and a N-type guard ring (N-ISO) may be formed in N-well 110 and may space P-well 112 from the peripheral thereof.

STI area 160 may be formed between emitter E and base B and between collector C and the N-type guard ring (N-ISO) and may partition each area.

Each upper layer of emitter E, base B, and collector C area may be formed with emitter contact area 126 and collector contact area 130, where a high concentration of N-type ionss may be implanted, and base contact area 128, where P-type ionss may be implanted. An upper layer of the N-type guard ring (N-ISO) area may be formed with a guard ring contact area where a high concentration of N-type ions may be implanted.

Emitter contact area 126, collector contact area 130, base contact area 128, and the N-type guard ring (N-ISO) area may each contact metal electrodes 133a, 133b, 133c, and 133d.

The P-well may be formed with the emitter and the collector together, which may allow for the electrons implanted from the N-type emitter E to flow to the N-type collector C, and may form horizontal collector current IC in a normal active mode.

However, the ratio of base current IB to collector current IC in the bipolar junction transistor element BJT, that is, IC/IB may be referred to as a common emitter current gain (beta), and may be an important specification that may determine DC performance of the element.

There may be a problem that the current gain of the horizontal type bipolar junction transistor (BJT) element in the related art may be small because the base layer may be wide. For example, the current gain of a horizontal type bipolar junction transistor (BJT) element may be smaller than that of a vertical type bipolar junction transistor element in which current may flow vertically.

Moreover, since the current flow may be non-uniform in view of a element structure, it may be difficult to expect and model current.

SUMMARY

Embodiments relate to a CMOS image sensor. Embodiments relate to a horizontal type bipolar junction transistor and a method of manufacturing the same, and a CMOS image sensor having the same and a method of manufacturing the same.

Embodiments relate to a bipolar junction transistor and a method of manufacturing the same, and a CMOS image sensor having the same and a method of manufacturing the same that may simplify a manufacturing process, obtain a large current gain, and simplify current expectation by being formed simultaneously with a photodiode area.

In embodiments, a bipolar junction transistor may include a semiconductor device where at least on epi-layer is formed on a semiconductor substrate, a first conductive collector area vertically stacked on at least two layers of the semiconductor substrate and the epi-layer, a first conductive emitter area vertically stacked on at least two layer of the semiconductor substrate and the epi-layer adjacent the collector area, and a second conductive base area formed on the semiconductor substrate and the epi-layer.

In embodiments, a method of manufacturing a bipolar junction transistor may include preparing a second conductive substrate, forming a first collector area and a first emitter area by implanting first conductive ion on the second conductive substrate, forming a first epi-layer on the second conductive substrate and forming a second collector area connected to the first collector area and a second emitter area connected to the first emitter area by implanting the first conductive ion on the first epi-layer, forming a third collector area connected to the second collector area and a third emitter area connected to the second emitter area by implanting the first conductive ion on the first epi-layer, forming a second epi-layer and a STI area on the first epi-layer, forming a P-well by implanting second conductive impurity on the second epi-layer and forming a fourth collector area connected to a third collector area and a fourth emitter area connected to the third emitter area by implanting the first conductive impurity on the second epi-layer, forming a collector contact area on the fourth collector area and an emitter contact area on the fourth emitter area by implanting the first conductive ion on the second epi-layer, and forming a base contact area by implanting second conductive ion on the second epi-layer.

In embodiments, a CMOS image sensor having a bipolar junction transistor may include a first conductive red photodiode, a first conductive first collector area, and a first conductive first emitter area formed on a second conductive substrate, a first epi-layer having a first conductive first plug connected to the red photodiode, a second collector area connected to the first collector area, and a second emitter area connected to the first emitter area, a first conductive green photodiode formed by implanting ion on the first epi-layer, a third collector area connected to the second collector area, and a first conductive emitter area connected to a second emitter area, a second epi layer having a first conductive second plug connected to the green photodiode, a fourth emitter area connected to the third emitter area, and a fourth collector area connected to the third collector area, a first conductive blue photodiode, a first conductive emitter contact area connected to the fourth emitter area, and a collector contact area connected to the fourth collector area formed on the second epi-layer, and a second conductive base contact area formed on the second epi-layer.

In embodiments, a method of manufacturing a CMOS image sensor having a bipolar junction transistor and defining a photodiode area and a bipolar junction transistor forming area, may include preparing a second conductive substrate, forming a red photodiode and a first collector area and a first emitter area by implanting first conductive ion on the second conductive substrate, forming a first epi-layer on the second conductive substrate and forming a first plug connected to the red photodiode and a second collector area connected to the first collector area and a second emitter area connected to the first emitter area by implanting the first conductive ion on the first epi-layer, forming a green photodiode and a third collector area connected to the second collector area and a third emitter area connected to the second emitter area by implanting the first conductive ion on the first epi-layer, forming a second epi-layer and a STI area on the first epi-layer, forming a P-well by implanting second conductive impurity on the second epi-layer and forming a second plug and fourth collector area connected to a third collector area and a fourth emitter area connected to the third emitter area by implanting the first conductive impurity on the second epi-layer, forming a blue photodiode and a collector contact area connected to the fourth collector area and an emitter contact area connected to the fourth emitter area by implanting the first conductive ion on the second epi-layer, and forming a base contact area by implanting second conductive ion on the second epi-layer.

DRAWINGS

DESCRIPTION

Figure 1:
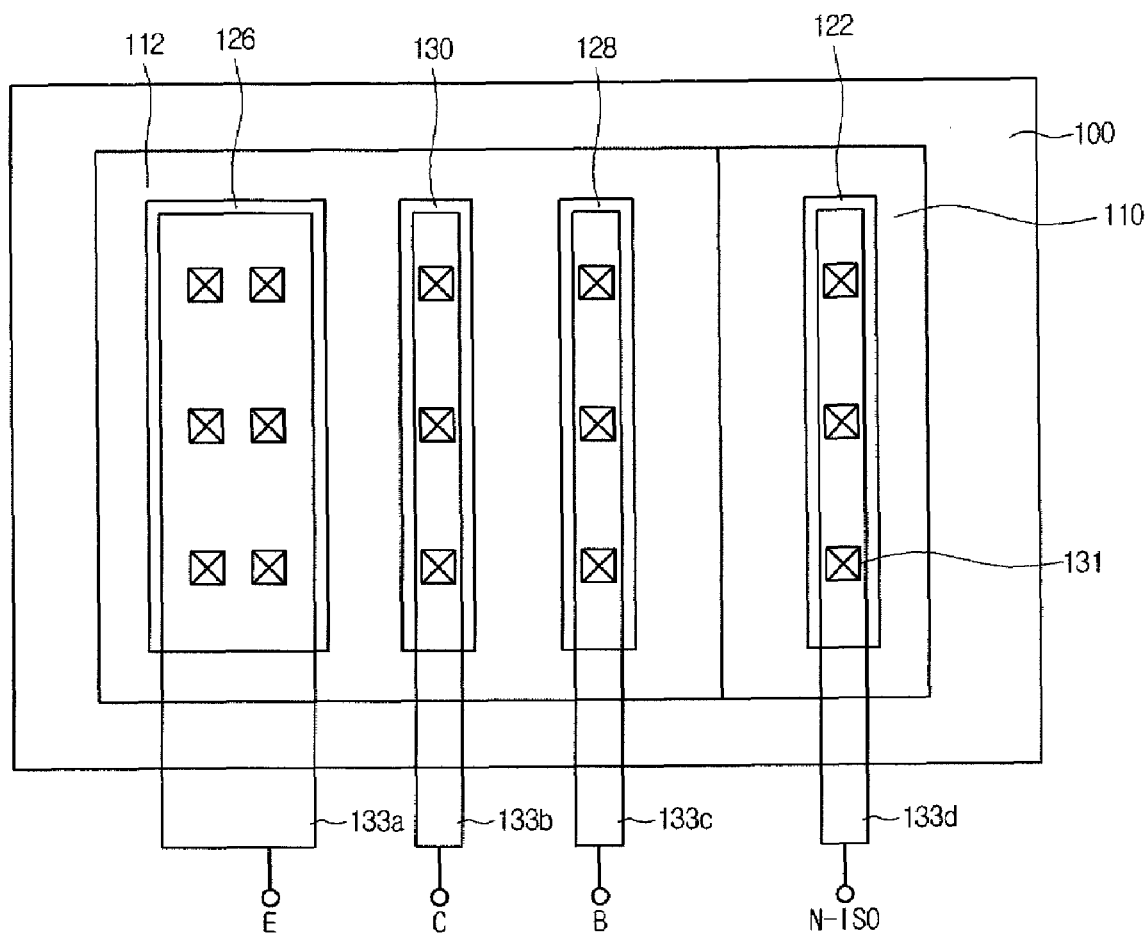
FIG. 1 is a drawing illustrating a related art horizontal type NPN bipolar junction transistor element.
Figure 2:
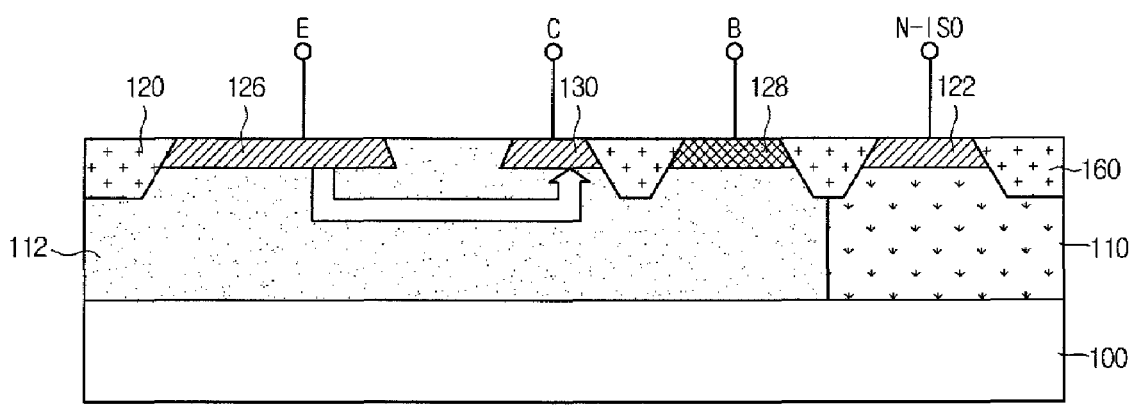
FIG. 2 is a cross-sectional drawing illustrating a horizontal type NPN bipolar junction transistor element illustrated in FIG. 1.
Figure 3:
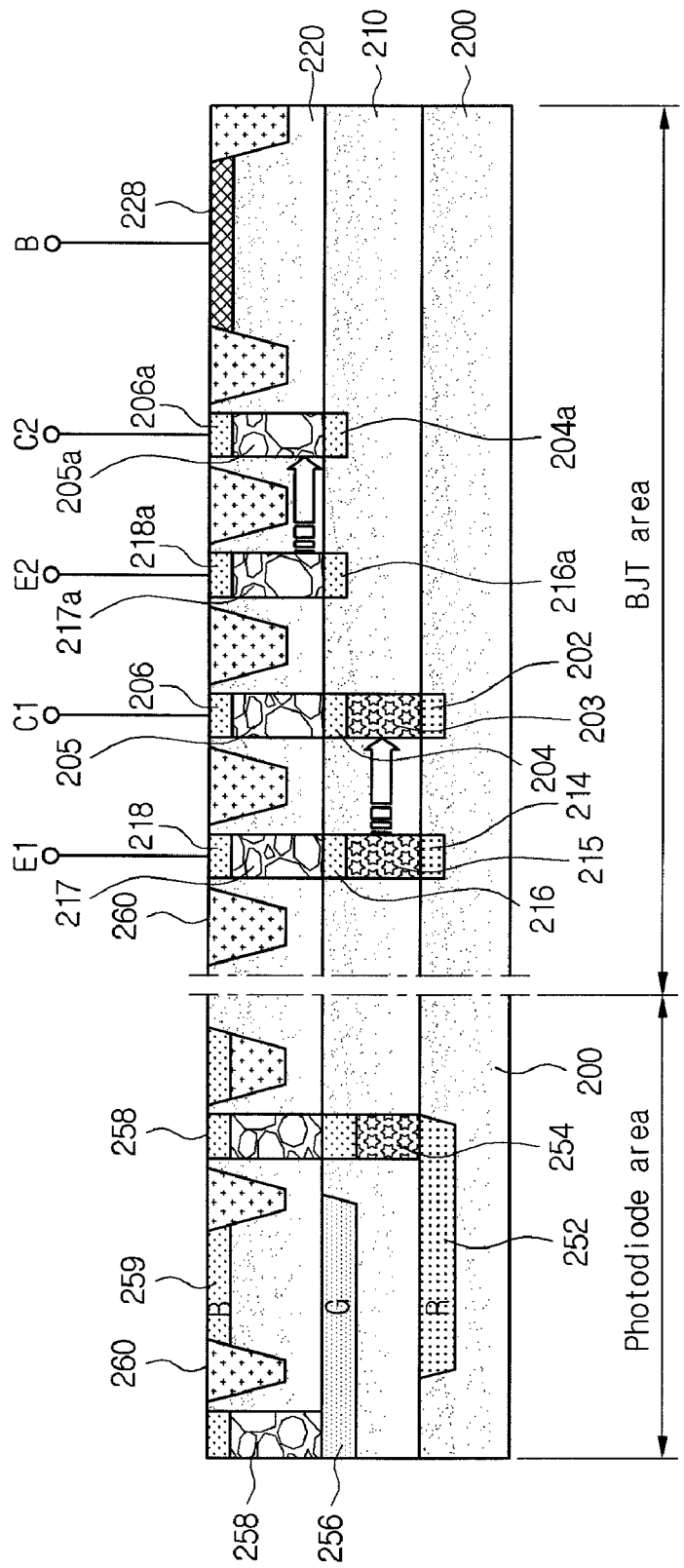
FIG. 3 is a cross-sectional drawing illustrating a photodiode area and a bipolar junction transistor area in a CMOS image sensor according to embodiments.

Referring to FIG. 3, in a photodiode area, a P-type semiconductor substrate 200 formed on a semiconductor substrate may be formed with red photodiode area 252. First epi-layer 210 may be grown, and first plug 254 may be formed by implanting high-concentration ions on P-type first epi-layer 210. P-type first epi-layer 210 formed by implanting P-type ionss on first epi-layer 210 may thus be connected to red photodiode area 252 and may extract signals.

P-type first epi-layer 210 may be formed with a photo resist pattern (not shown). A portion thereof may be implanted with ions. P-type first epi-layer 210 may be formed with green photodiode area 256. Second epi-layer 220 may be grown on P-type first epi-layer 210, including green photodiode area 256, and second epi-layer 220 may be formed with a shallow trench isolation area 260 to define an active area.

Photo resist pattern (not shown) may be formed on second epi-layer 220. A photo resist pattern (not shown) and second plug 258 may be formed on second epi-layer 220 by implanting ions.

The photo resist pattern (not shown) may be formed on the P-type second epi-layer 220 including STI area 260 by performing a well process. Second plug 258 may be formed on first plug 254 connected to red photodiode area 252 by implanting ions, and second plug 258 connected to green photodiode area 256 may also be formed.

The photo resist pattern may be formed on the P-type second epi-layer 220 and blue photodiode area 259 may be formed by implanting ion.

Red photodiode area 252, green photodiode area 256, and blue photodiode area 259 may be vertically arranged to form one pixel.

Figure 4:
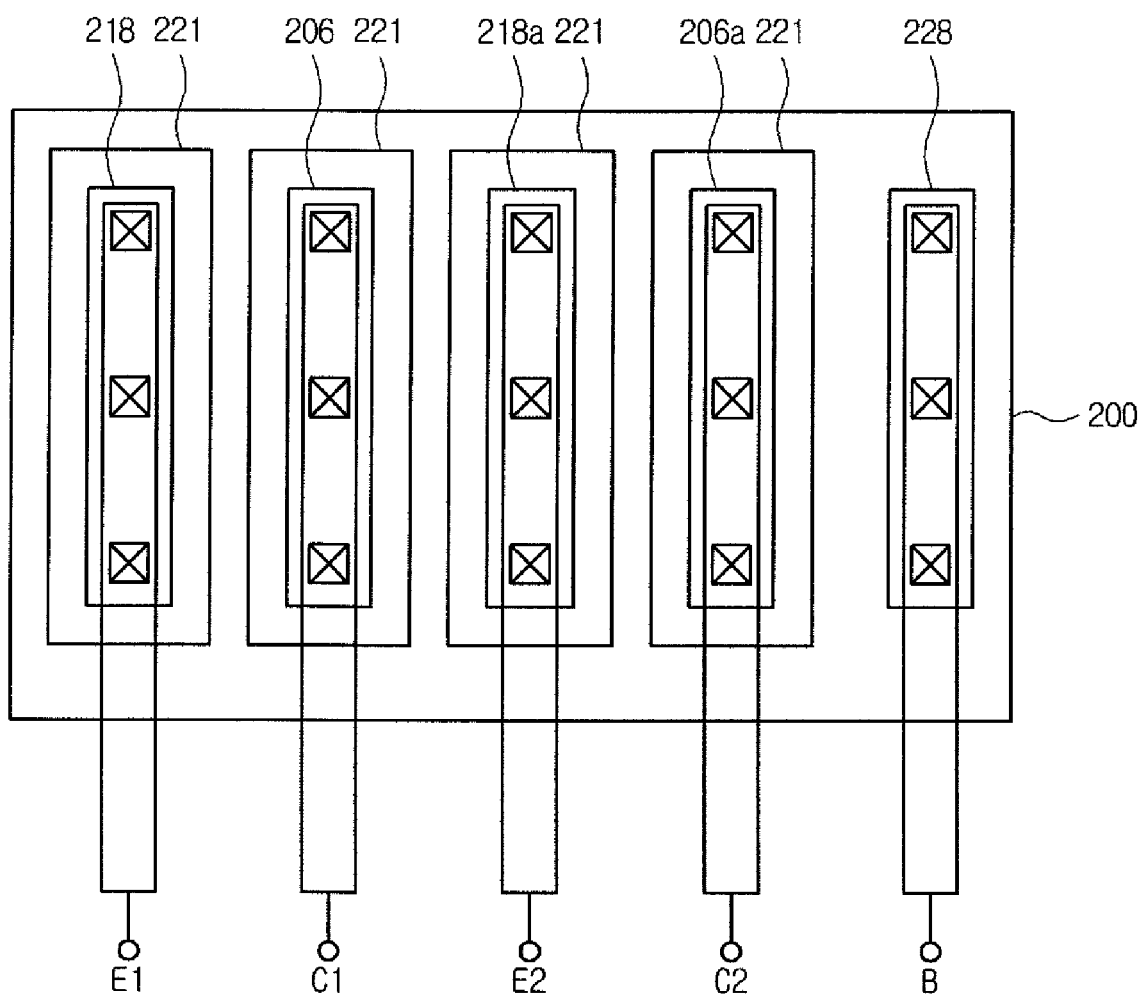
FIG. 4 is a drawing illustrating a bipolar junction transistor area of FIG. 3.

Referring to FIGS. 3 and 4, a first and second NPN bipolar junction transistor formed of an emitter area, a collector area, and a base area (common) are shown.

In the first NPN bipolar junctions transistor, collector current IC may flow from first emitter area E1 to first collector area C1. In embodiments, since a facing area of first emitter area E1 and first collector area C1 may be large, a large amount of current corresponding to this may uniformly flow.

In embodiments, in the second NPN bipolar junction transistor collector, current IC may flow from second emitter area E2 to second collector area C2. Since a facing area of second emitter area E2 and second collector area C2 may be smaller than the first NPN bipolar junction transistor, collector current smaller than the first NPN bipolar junction transistor may uniformly flow.

In embodiments, base area B of the first and second NPN bipolar junction transistors may be commonly used.

According to embodiments, the bipolar junction transistor having various current gains can be formed.

In the NPN bipolar junction transistor area according to embodiments, when forming red photodiode area 252 on the P-type semiconductor substrate 200, N-type a first collector area 202 and first emitter area 214 may also be formed.

When forming first plug 254, in the first NPN bipolar junction transistor a N-type second collector area 203, which may be configured to be connected to first collector area 202, and a N-type second emitter area 215, which may be configured to be connected to first emitter area 214, may be formed.

When forming green photodiode area 256 on first epi-layer 210, in the first NPN bipolar junction transistor, an N-type third emitter area 216, which may be configured to be connected to second emitter area 215, and a N-type third collector area 204, which may be configured to be connected to a N-type third collector area 204, may be formed on first epi-layer 210.

In embodiments, the second NPN bipolar junction transistor may be formed with third emitter area 216a and third collector area 204a.

In embodiments, in the first NPN bipolar junction transistor, first to third emitter areas 214, 215, and 216 may be connected and formed in a vertical direction, and first to third collector areas 202, 203, and 204 may be connected and formed in a vertical direction.

In embodiments, in the first NPN bipolar junction transistor, when forming second plug 258, fourth collector area 205 may be formed so that it can contact third collector area 204 and may be connected to an upper layer thereof and fourth emitter area 218 may be formed so that it can contact the emitter area 217 and may be connected to the upper layer thereof.

In embodiments, in the second NPN bipolar junction transistor, fourth emitter area 217a, which may be connected to third emitter area 216a, and fourth collector area 205a, which may be connected to third collector area 204a, may be formed.

In embodiments, when forming blue photodiode area 259 on second epi-layer 220, the N-type the emitter contact area 218 may be formed on fourth emitter area 217 and N-type collector contact area 206 may be formed to be contacted with fourth collector area 205.

In embodiments, emitter area 214 and collector area 202, etc., may be formed with a separate photo resist pattern from the P-type base contact area 228.

In embodiments, between emitter E, base B, and collector C may be STI area 260 partitioning each area.

Base area B may be formed of semiconductor substrate 200, first epi-layer 210, and second epi-layer 220.

Accordingly, in embodiments, the first NPN bipolar junction transistor may implant and move electrons from first to fourth emitter areas 214, 215, 216, and 217 to first to fourth collector areas 202, 203, 204, and 205.

In embodiments, in the NPN bipolar junction transistor element BJT, a ratio of the base current IB to collector current (IC), that is, IC/IB, may be referred to as common emitter current gain (beta) so that collector current may uniformly flow in a horizontal direction according to the NPN bipolar junction transistor structure so that the amount of current may be increased. This may make it possible to obtain a large current gain if the bipolar junction transistor element is manufactured with the same area as a related art bipolar junction transistor element.

In embodiments, as can be appreciated from the first NPN bipolar junction transistor and the second NPN bipolar junction transistor, the bipolar junction transistor element with various current gains may be manufactured by changing the emitter area E and the collector area C and a width of the base layer.

FIGS. 5A to 5K illustrate a manufacturing process of the bipolar junction transistor according to embodiments.

Figure 5A:
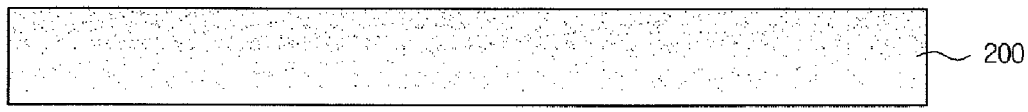
FIGS. 5A to 5K are drawings illustrating a manufacturing process of a bipolar junction transistor according to embodiments.

Referring to FIG. 5A, semiconductor substrate 200 may be prepared and the substrate 200 may be implanted with P-type ions, for example, boron B ions, to prepare the P-type semiconductor substrate 200.

Figure 5B:

Referring to FIG. 5B, first photo resist pattern 281 may be formed on P-type semiconductor substrate 200. P-type semiconductor substrate 200 may be exposed through an opening in first photo resist pattern 281 and may be implanted with N-type ions, for example, As ions, at several tens keV energy, according to embodiments. This may form red photodiode 252 (see FIG. 3) and may simultaneously form first collector area 202 and first emitter area 214.

First photo resist pattern 281 may be removed.

Figure 5C:
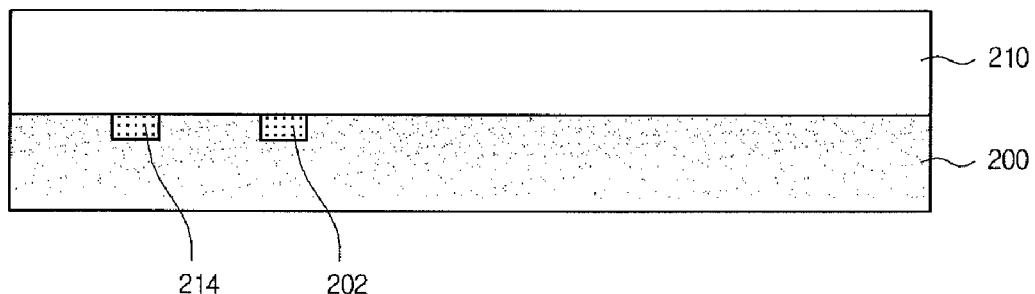

Referring to FIG. 5C, first epi-layer 210 may be formed on P-type semiconductor substrate 200 on which first collector area 202 may have been formed.

Figure 5D:
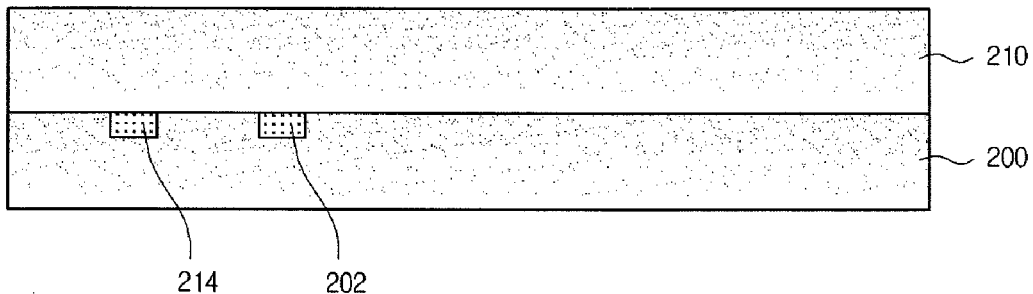

Referring to FIG. 5D, first epi-layer 210 may be implanted with the P-type ions, for example, boron (B) ions, to prepare P-type first epi-layer 210.

Figure 5E:
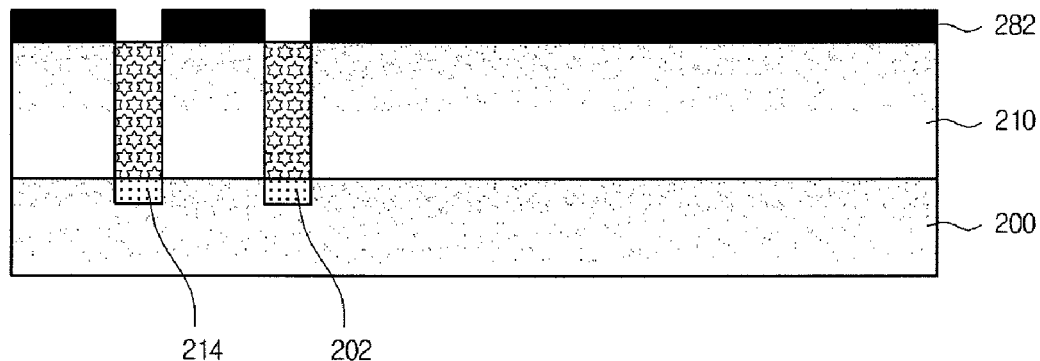

Referring to FIG. 5E, second photo resist pattern 282 may be formed on P-type first epi-layer 210 and first plug 254 (see FIG. 3) may be formed. At the same time, the second collector area 203 and the second emitter area 215 may be formed by implanting N-type ions, for example, As ions, at several hundreds to several thousands keV energy on first epi-layer 210 exposed through an opening of second photo resist pattern 282.

Second photo resist pattern 282 may be removed.

Figure 5F:
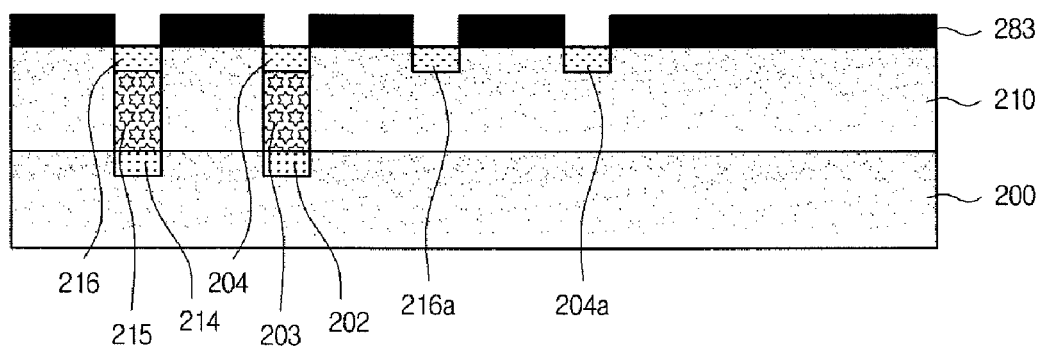
Figure 5G:
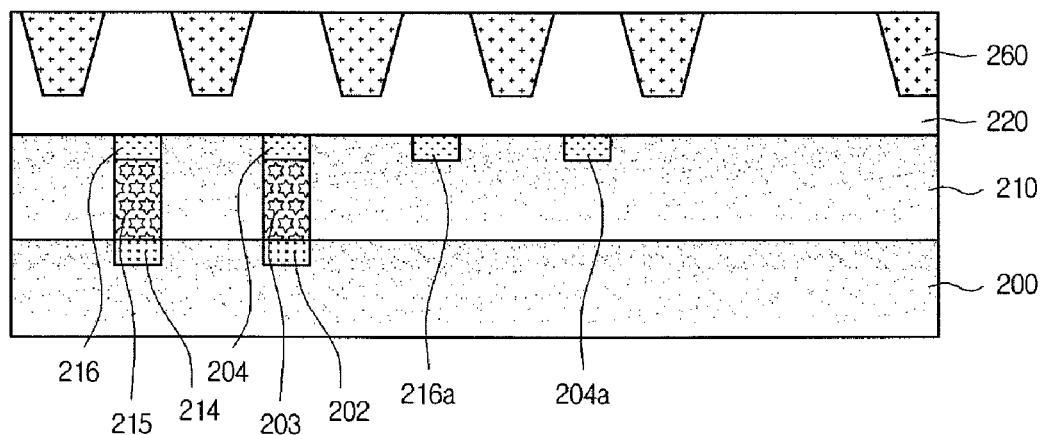

Referring to FIG. 5F, third photo resist pattern 283 may be formed on P-type first epi-layer 210 and blue photodiode 256 (see FIG. 3) may be formed. At the same time, third collector area 204 and third emitter area 216 may be formed by implanting N-type ions, for example, As ions, at several tens keV energy on P-type first epi-layer 210 that may be exposed through the opening of third photo resist pattern 283.

Third photo resist pattern 283 may be removed.

Referring to FIG. 5Q second epi-layer 220 may be formed on P-type first epi-layer 210.

Shallow trench isolation 260, which may be an isolating area, may be formed on second epi-layer 220.

Figure 5H:
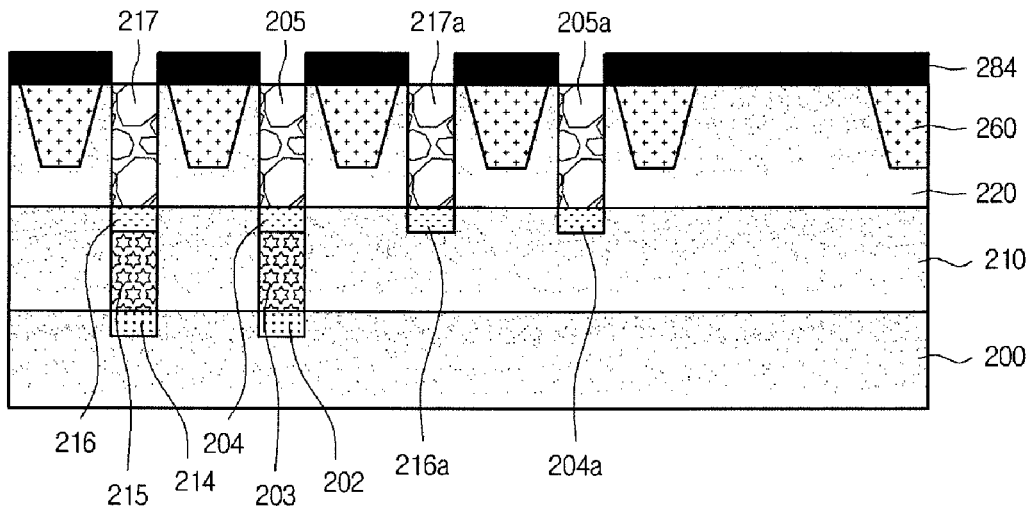

Referring to FIG. 5H, fourth photo resist pattern 284 may be formed on second epi-layer 220 on which the P-well 221 may be formed and the second plug (see FIG. 3) may be formed. At the same time, fourth collector area 205 and fourth emitter area 217 may be formed by implanting N-type ions, for example, As ions at several hundreds to several thousands keV energy on second epi-layer 220 exposed through the opening of fourth photo resist pattern 284.

Fourth photo resist pattern 284 may be removed.

Figure 5I:
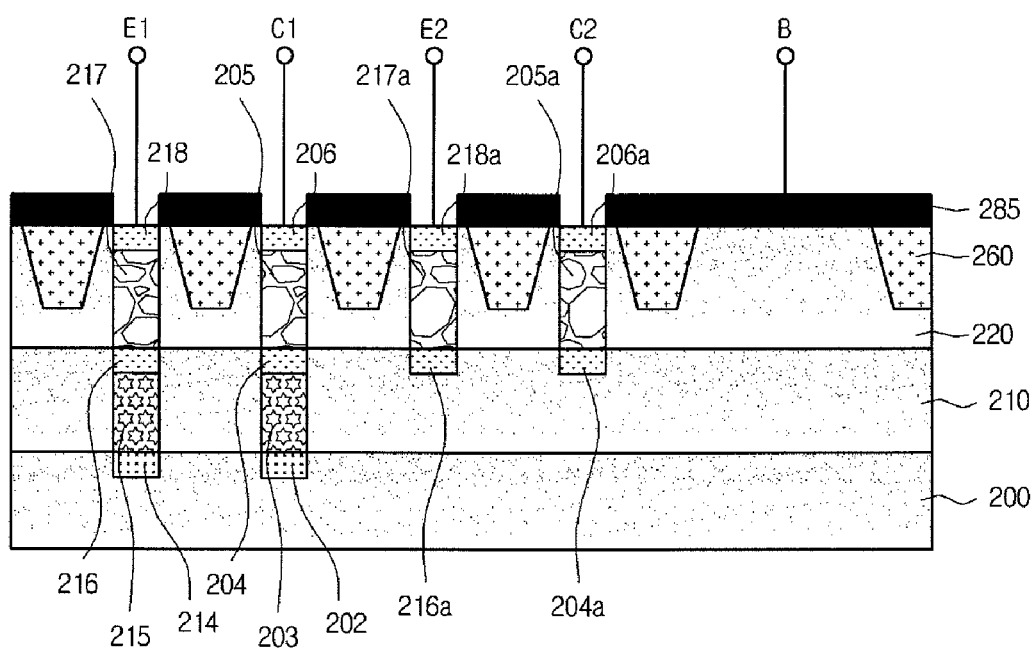
Figure 5J:
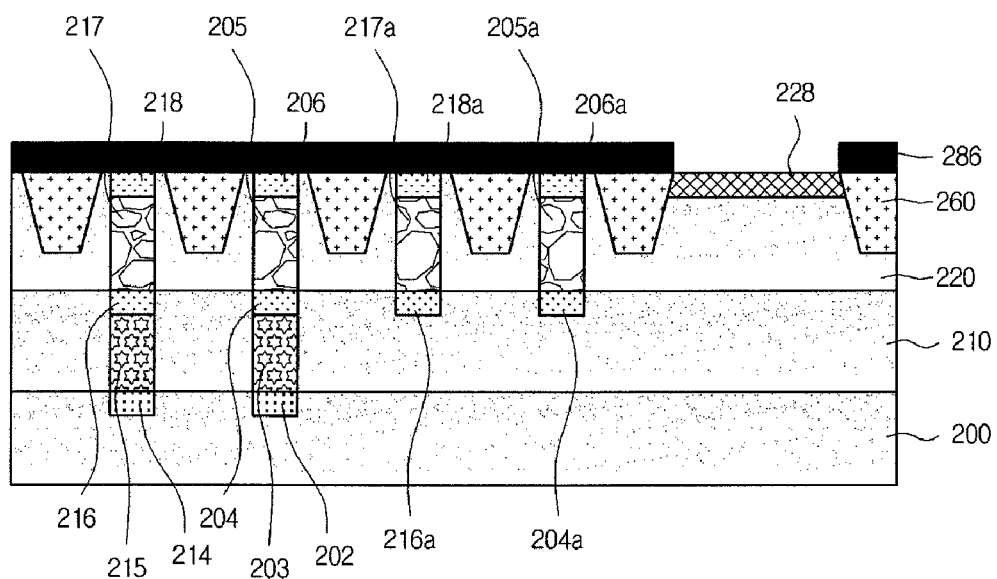

Referring to FIG. 5I, fifth photo resist pattern 285 may be formed on second epi-layer 220 and blue photodiode area 259 (see FIG. 3) may be formed. At the same time, emitter contact area 219 may be formed on fourth emitter area 217 and collector contact area 206 may be formed on fourth collector area 205.

Fifth photo resist pattern 285 may be removed.

Figure 5K:
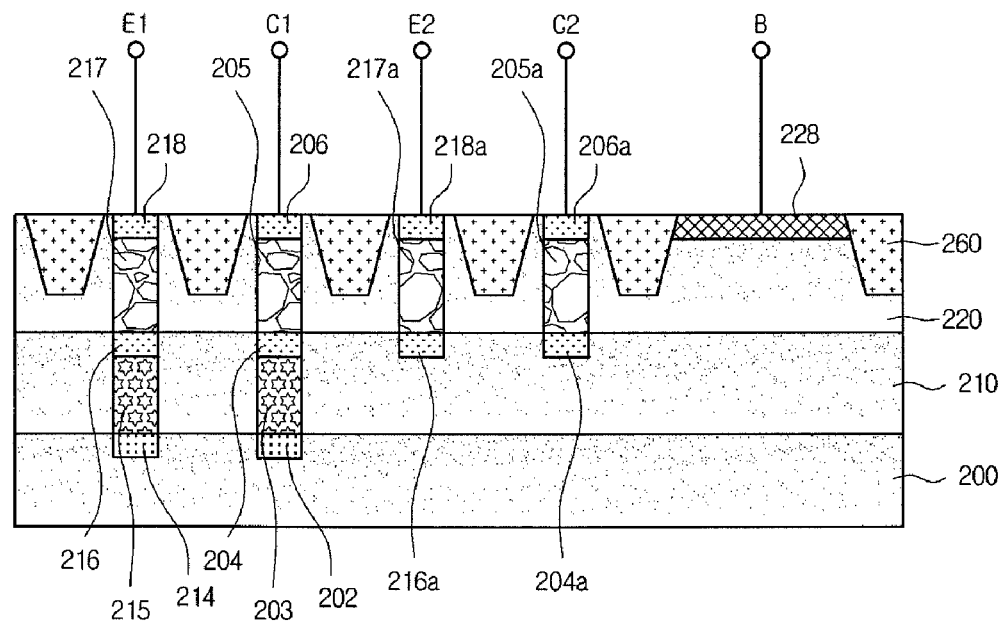

Referring to FIG. J, sixth photo resist pattern 286 may be formed on second epi-layer 220 and base contact area 228 may be formed by implanting P-type ions on a portion of second epi-layer 220 through the opening of sixth photo resist pattern 286. Finally, the NPN bipolar junction transistor in a double base structure using a photodiode process as illustrated in FIG. 5K may be formed.

Thereafter, the sixth photo resist pattern 286 may be removed.

In embodiments, collector current may uniformly flow in a horizontal direction according to the NPN bipolar junction transistor structure of embodiments and an entire amount of current may be increased. This may make it possible to obtain a large current gain when a bipolar junction transistor element may be manufactured with the same area as the related art bipolar junction transistor element.

In embodiments, as can be appreciated from the first NPN bipolar junction transistor and the second NPN bipolar junction transistor, the bipolar junction transistor element with various current gains may be manufactured by changing a size of the emitter area E and the collector area C and the width of the base layer.

In embodiments, the horizontal type bipolar junction transistor element (BJT) and the CMOS image sensor having the same may form a photodiode. In embodiments, the bipolar junction transistor as well as collector current may flow uniformly in a horizontal direction so that the entire amount of current may be increased. This may make it possible to obtain large current gain if the bipolar junction transistor element is manufactured with the same area as the related art bipolar junction transistor element.

In embodiments, changes to the size of the stacked emitter area and the collector area or changes to the width of the base layer may be provided so that the bipolar junction transistor element with various current gains can be manufactured.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A CMOS image sensor having a bipolar junction transistor, comprising:
   a first photodiode of a first conductivity, a first collector area of the first conductivity, and a first emitter area of the first conductivity formed over a conductive substrate;
   a first epi-layer having a first plug of the first conductivity connected to the first photodiode, a second collector area connected to the first collector area, and a second emitter area connected to the first emitter area;
   a second photodiode of the first conductivity formed by implanting ions in the first epi-layer, and a third collector area connected to the second collector area, and a third emitter area connected to the second emitter area in the first epi-layer;
   a second epi-layer over the first epi-layer and having a second plug of the first conductivity connected to the second photodiode, a fourth emitter area connected to the third emitter area, and a fourth collector area connected to the third collector area;
   a third photodiode of the first conductivity, an emitter contact area of the first conductivity connected to the fourth emitter area, and a collector contact area of the first conductivity connected to the fourth collector area formed on the second epi-layer; and
   a base contact area of a second conductivity formed over the second epi-layer.

2. The sensor of claim 1, wherein the first photodiode comprises a red photodiode, the second photodiode comprises a green photodiode, and the third photodiode comprises a blue photodiode.

3. The sensor of claim 1, wherein the first and second epi-layers comprise the second conductivity.

4. The sensor of claim 1, wherein the first epi-layer and the second epi-layer are defined by a base area of the second conductivity.

5. The sensor of claim 1, wherein the second epi-layer comprises a shallow trench isolation (STI) isolating the emitter contact area, collector contact area, and the base contact area.

6. The sensor of claim 1, wherein the first conductivity is implanted with N-type ions and the second conductivity is implanted with P-type ions.

7. The sensor of claim 1, wherein the first, second, third, and fourth emitter areas and the first, second, third, and fourth collector areas comprise the first conductivity.

8. A method of manufacturing a CMOS image sensor, comprising:
   preparing a substrate of a second conductivity;
   forming a first photodiode, a first collector area, and a first emitter area by implanting ions of a first conductivity in the substrate;
   forming a first epi-layer over the substrate and forming a first plug connected to the first photodiode and a second collector area connected to the first collector area and a second emitter area connected to the first emitter area by implanting ions of the first conductivity in the first epi-layer;
   forming a second photodiode and a third collector area connected to the second collector area and a third emitter area connected to the second emitter area by implanting ions of the first conductivity in the first epi-layer;
   forming a second epi-layer and a STI area over the first epi-layer;
   forming a P-well by implanting impurities of the second conductivity in the second epi-layer and forming a second plug and fourth collector area connected to the third collector area and a fourth emitter area connected to the third emitter area by implanting impurities of the first conductivity in the second epi-layer;
   forming a third photodiode and a collector contact area connected to the fourth collector area and an emitter contact area connected to the fourth emitter area by implanting ions of the first conductivity in the second epi-layer; and
   forming a base contact area by implanting ions of the second conductivity in the second epi-layer.

9. The method of claim 8, wherein the first photodiode comprises a red photodiode, the second photodiode comprises a green photodiode, and the third photodiode comprises a blue photodiode.

10. The method of claim 8, wherein the emitter areas and collector areas are configured such that current flows from the first to fourth emitter areas to the first to fourth collector areas.

11. The method of claim 8, wherein the semiconductor substrate, the first epi-layer, and the second epi-layer form a base region of the second conductivity.

12. The method of claim 8, wherein the bipolar junction transistor comprises an NPN type transistor.

13. The method of claim 8, wherein the first conductivity is formed by implanting N-type ions and the second conductivity is formed by implanting P-type ions.

* * * * *